United States Patent
Doyle et al.

(10) Patent No.: US 7,268,593 B1
(45) Date of Patent: Sep. 11, 2007

(54) APPARATUS AND METHOD FOR SINGLE PIN CURRENT-PROGRAMMABLE MULTI-FUNCTION/MULTI-PURPOSE SELECTOR

(75) Inventors: James Thomas Doyle, Nederland, CO (US); Dae Woon Kang, Boulder, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 148 days.

(21) Appl. No.: 11/197,053

(22) Filed: Aug. 3, 2005

(51) Int. Cl.
*H03K 5/22* (2006.01)
(52) U.S. Cl. ...................................................... 327/77
(58) Field of Classification Search ............... 327/77, 327/80, 81, 87, 88, 89
See application file for complete search history.

(56) References Cited

U.S. PATENT DOCUMENTS 5,642,064 A * 6/1997 Shimura ................. 327/103
6,028,456 A * 2/2000 Littlefield ................. 327/74

OTHER PUBLICATIONS

RF, RFIC & Microwave Theory Design, "Improved Cascode Current Mirror," pp. 1-7, http://www.odyseus.nildram.co.uk/RFIC_Subcircuits_Files/Improved_CMOS_Cascode_Current_Mirror.pdf, no date.

* cited by examiner

*Primary Examiner*—Jeffrey Zweizig
(74) *Attorney, Agent, or Firm*—Darby & Darby P.C.; Matthew M. Gaffney

(57) ABSTRACT

A circuit for providing an output current is provided. The circuit includes a differential amplifier, a transistor having a gate that is coupled to the output of the differential amplifier, a comparator, and a sense resistor that is coupled between the drain of the transistor and the input pin. One input of the differential amplifier is connected to the input pin and the other input is connected to a reference voltage. The inputs of the comparator are coupled across the sense resistor. If an external resistor is coupled to the input pin, the comparator trips. If the comparator is tripped, the current from the external resistor is mirrored to provide the output current. If the comparator is not tripped, the output current is provided from an on-chip current source.

20 Claims, 4 Drawing Sheets

APPARATUS AND METHOD FOR SINGLE PIN CURRENT-PROGRAMMABLE MULTI-FUNCTION/MULTI-PURPOSE SELECTOR

FIELD OF THE INVENTION

The invention is related to electronic circuits, and in particular, to an apparatus and method for a single pin current current-programmable multi-function/multi-purpose selector for a current and voltage reference.

BACKGROUND OF THE INVENTION

An integrated circuit typically needs both a voltage source and a current source. The voltage source is typically a bandgap reference. The current source may be provided internally (an on-chip current source), or may be provided based an external resistor. Obtaining precision analog circuits on chip can be difficult since the resistors themselves vary greatly and high-order temperatures curvature can cause non-optimal temperature variations. Conversely, external-resistor based current sources have the advantage that they can be very accurate. Precise external resistor values and flat temperature characteristics (<1%) may be readily obtained. These precise resistor values can be used in conjunction with an on-chip bandgap reference which is precise using an error amplifier to control the voltage drop across the external resistor. However, a user may not necessarily want to use an external resistor.

BRIEF DESCRIPTION OF THE DRAWINGS

Non-limiting and non-exhaustive embodiments of the present invention are described with reference to the following drawings, in which.

DETAILED DESCRIPTION

Figure 1:
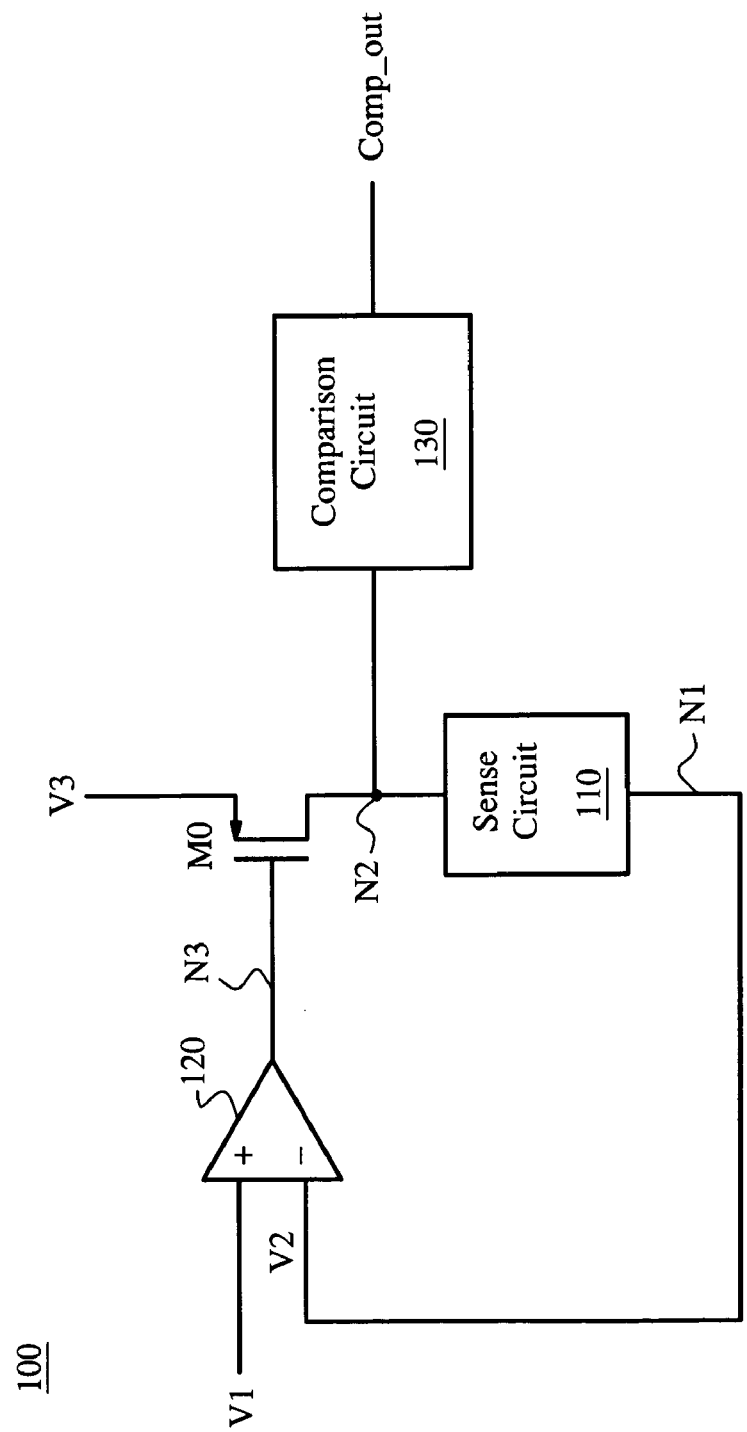
FIG. 1 illustrates a block diagram of an embodiment of a circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar transistor may be employed as an embodiment of a transistor, the scope of the words "gate", "drain", and "source" includes "base", "collector", and "emitter", respectively, and vice versa.

Briefly stated, the invention is related to a circuit for providing an output current. The circuit includes a differential amplifier, a transistor having a gate that is coupled to the output of the differential amplifier, a comparator, and a sense resistor that is coupled between the drain of the transistor and the input pin. One input of the differential amplifier is connected to the input pin and the other input is connected to a reference voltage. The inputs of the comparator are coupled across the sense resistor. If an external resistor is coupled to the input pin, the comparator trips. If the comparator is tripped, the current from the external resistor is mirrored to provide the output current. If the comparator is not tripped, the output current is provided from an on-chip current source.

FIG. 1 illustrates a block diagram of an embodiment of a circuit 100. Circuit 100 includes transistor M0, sense circuit 110, differential amplifier 120, and comparison circuit 130.

In operation, differential amplifier 120 is arranged to provide a signal at node N3 responsive to signals V1 and V2. Differential amplifier 120 is arranged in a closed loop so that differential amplifier 120 adjusts the gate voltage of transistor M0 so that voltage V2 at node N2 is substantially equal to voltage V1. In one embodiment, voltage V1 is a reference voltage, such as a bandgap reference voltage.

In one embodiment, circuit 100 is configured to perform multiple functions by coupling a resistor (not shown in FIG. 1) to node N1. If an external resistor is coupled to node N1, a current may be provided across sense circuit 110. By changing the value of the external resistor, the current across sense resistor 110 can be changed accordingly. In one embodiment, comparison circuit 130 is arranged to determine whether an external resistor is coupled to node N1. In another embodiment, comparison circuit 130 may have multiple trip points so that multiple functions of option selection can be made based on the value of the external resistor. If no external resistor is provided at node N1, transistor M0 pulls up node N2.

Comparison circuit 130 is arranged to provide signal Comp_out. In one embodiment, sense circuit 110 is a sense resistor. In one embodiment, comparison circuit 130 is a comparator. However, in other embodiments, comparison circuit 130 may be more or less complicated. In one embodiment, comparison circuit may be a simple decision circuit that turns on once a particular value is reached. In another embodiment, the sense resistor may have multiple taps, and comparator circuit 130 may include several comparators, each connected to a separate tap of the sense resistor for making multiple decision based on the exact resistor value.

In one embodiment, the value of the current provided from the external resistor can be mirrored to provide a reference current. In this way, the single pin may be provided at node N1 to provide two functions. First, in this embodiment, circuit 100 is employed to determine whether a resistor is coupled to node N1. If a resistor is not coupled to N1, then signal Comp_out is not asserted, and an on-chip voltage reference (not shown in FIG. 1) may be used. However, if a resistor is coupled to node N1, then signal Comp_out is asserted, and the on-chip voltage reference may be disabled. Also, the current provided to transistor M0 from the external resistor may be mirrored to provide a highly accurate current based on the external resistor. In this way, the use of two pins, one to select whether to use an external resistor or an on-chip current reference, and another pin for connecting to the external resistor, can be avoided. Instead, in this embodiment, both functions are accomplished by a single pin.

In another embodiment, a single pin may provide for more than two functions based on the value of the resistor provided. In one embodiment, an integrated circuit may have only one input pin, with every function of the integrated circuit selected based on the value of the resistor provided at the input pin.

In one embodiment, comparison circuit 130 is a comparator having one input that is coupled to node N1, and another input that is coupled to node N2. However, in another embodiment, comparison circuit 130 may be arranged differently than this. For example, in one embodiment, one of the inputs of the comparator is coupled to node N2, and the other input is coupled to a reference.

In one embodiment, as illustrated in FIG. 1, sense circuit 110 is included in the closed negative feedback loop of differential amplifier 120. In another embodiment, sense circuit 110 may be outside of the closed negative feedback loop.

Additionally, although embodiments in which sense circuit 110 is a sense resistor have been discussed above, in other embodiments, sense circuit 110 need not include a sense resistor, and may be arranged differently than illustrated in FIG. 1. For example, in one embodiment, sense circuit 110 is a sense transistor that is coupled in a current mirror arrangement with transistor M0. In this embodiment, sense circuit 210 is not connected to the drain of transistor M0 as shown in FIG. 1, but the gates of the sense transistor and transistor M0 are coupled together. Also, in this embodiment, comparison circuit 130 may be a current comparator that compares the drain current of the sense resistor with a reference current.

Figure 2:
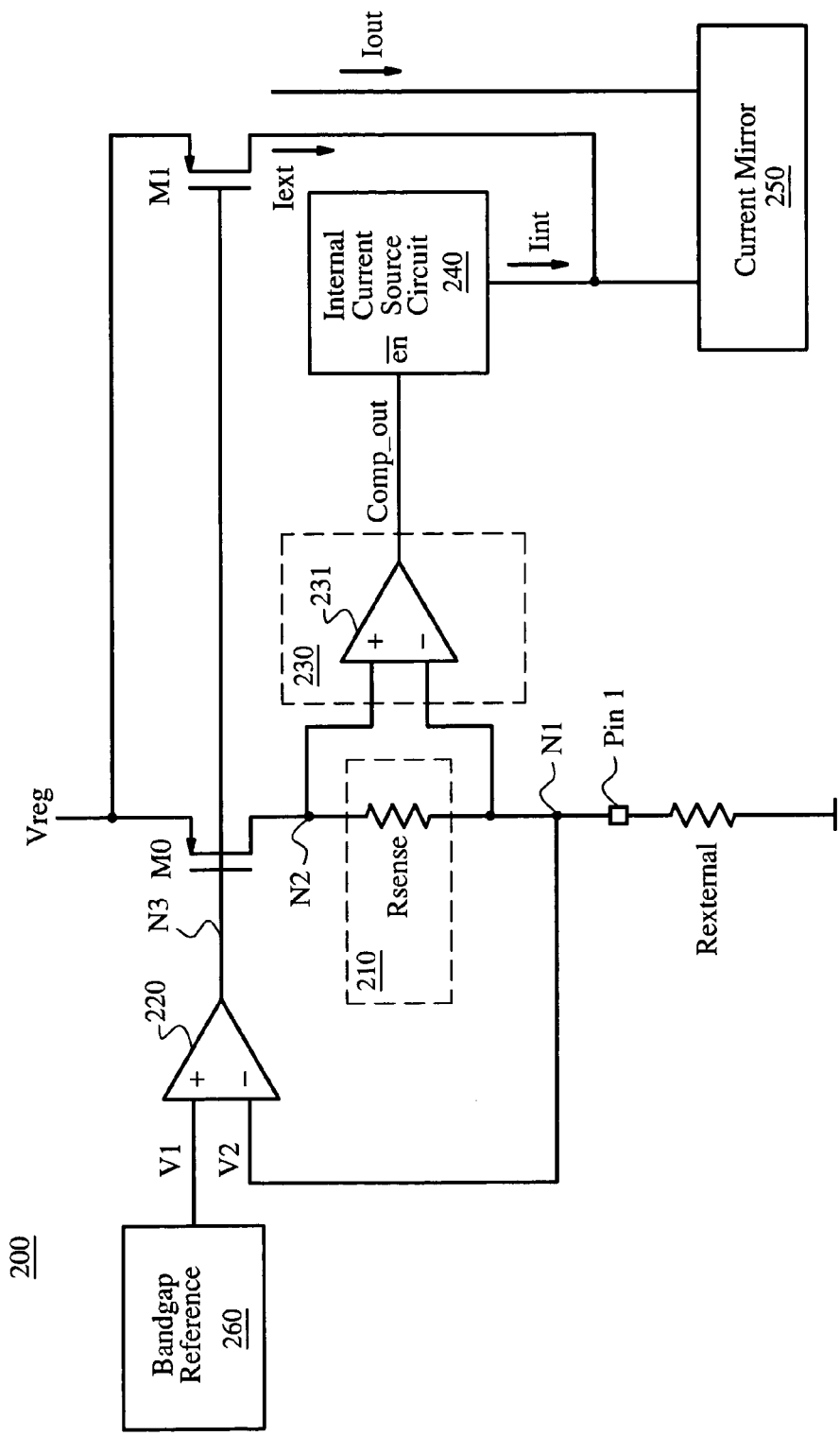
FIG. 2 shows a block diagram of an embodiment of the circuit of FIG. 1.

FIG. 2 shows a block diagram of an embodiment of circuit 200. Circuit 200 may be employed as an embodiment of circuit 100 of FIG. 1. Circuit 200 further includes transistor M1, internal current source circuit 240, current mirror 250, bandgap reference 260, and Pin 1. Further, circuit 200 is arranged to detect the presence or absence of an external resistor coupled to Pin 1. An embodiment of sense circuit 210 includes sense resistor Rsense. An embodiment of comparison circuit 230 includes comparator 231. In one embodiment, all of the components illustrated in FIG. 2 are on chip except for resistor Rexternal.

In operation, bandgap reference 260 provides voltage V1. Transistor M0 is arranged to receive regulated voltage Vreg at the source of transistor M0. Also, voltage Vreg is an embodiment of voltage V3 of FIG. 1.

If no external resistor is coupled to Pin 1, circuit 200 operates as follows. Transistor M0 pulls up node N2, and the drain current of transistor M0 is substantially zero. Accordingly, the voltage drop across resistor Rsense is substantially zero, and comparator 231 is not tripped (comparator 231 includes hysteresis). Internal current source circuit 240 is an on-chip current source that provides current Iint. Further, current Iext is substantially zero. Current Iint is mirrored by current mirror 250 to provide output current Iout.

However, if external resistor Rexternal is coupled to Pin 1, circuit 200 operates as follows. Resistor Rexternal provides a current of approximately V2/Rexternal. Accordingly, a voltage drop appears across resistor Rsense, causing comparator 231 to trip, which in turn causes signal Comp_out to be asserted. Internal current source circuit 240 receives signal Comp_out at an enable input. Further, internal current source circuit 240 is disabled in response to the assertion of signal Comp_out. Transistor M1 is configured in a current mirror relationship with transistor M1 to provide external resistor based current Iext. Also, current Iext is mirrored by current mirror 250 to provide output current Iout.

By disabling internal current source circuit 240 when signal Comp_out is asserted, standby current is reduced since only one reference current is provided.

In one embodiment, bandgap reference 260 is a combined bandgap reference/sub-bandgap reference/proportional to absolute temperature (PTAT) current generation circuit. In this embodiment, the combined bandgap reference/sub-bandgap reference/PTAT current generation circuit is further arranged to provide a PTAT current to internal current source circuit 240.

Although one embodiment of circuit 200 is illustrated in FIG. 2, other embodiments are within the scope and spirit of the invention. For example, current mirror 250 need not be included in circuit 200. Also, in one embodiment, as discussed above with respect to FIG. 1, sense resistor Rsense may be outside of the closed feedback loop. In this embodiment, the non-inverting input of differential amplifier 220 is connected to node N2 instead of node N1. This embodiment is within the scope of the invention, but it is not preferred, because it would introduce an additional voltage drop; the drain current of transistor M0 would be V1/(Rexternal+Rsense) rather than V1/Rexternal.

Also, circuit 200 may include more or less components than shown in FIG. 2. For example, in one embodiment, circuit 200 includes a regulator circuit which provides regulated voltage Vreg from an unregulated voltage Vunreg. Further, bandgap reference 260 and internal current source circuit 240 may employ voltage Vunreg as a source voltage. A level-shifter may be coupled between the output of comparator 231 and the enable input of internal current source circuit 240. Further, in one embodiment, pre-regulation for the external resistor based current may be provided.

Although not shown in FIG. 2, circuit 200 may include additional circuitry for determining whether resistor Rexternal is connected prior to bandgap reference 260 being turned on. For example, in one embodiment, a simple threshold reference is provided by a resistor bias current reference (not shown in FIG. 2). Once the presence or absence of an external resistor is sensed, then the reference is switched over to the bandgap reference. Also, additional gates may be included to select the internal reference versus the external reference to avoid current summing (of both references being on at the same time) during transitions and handoffs.

Figure 3:
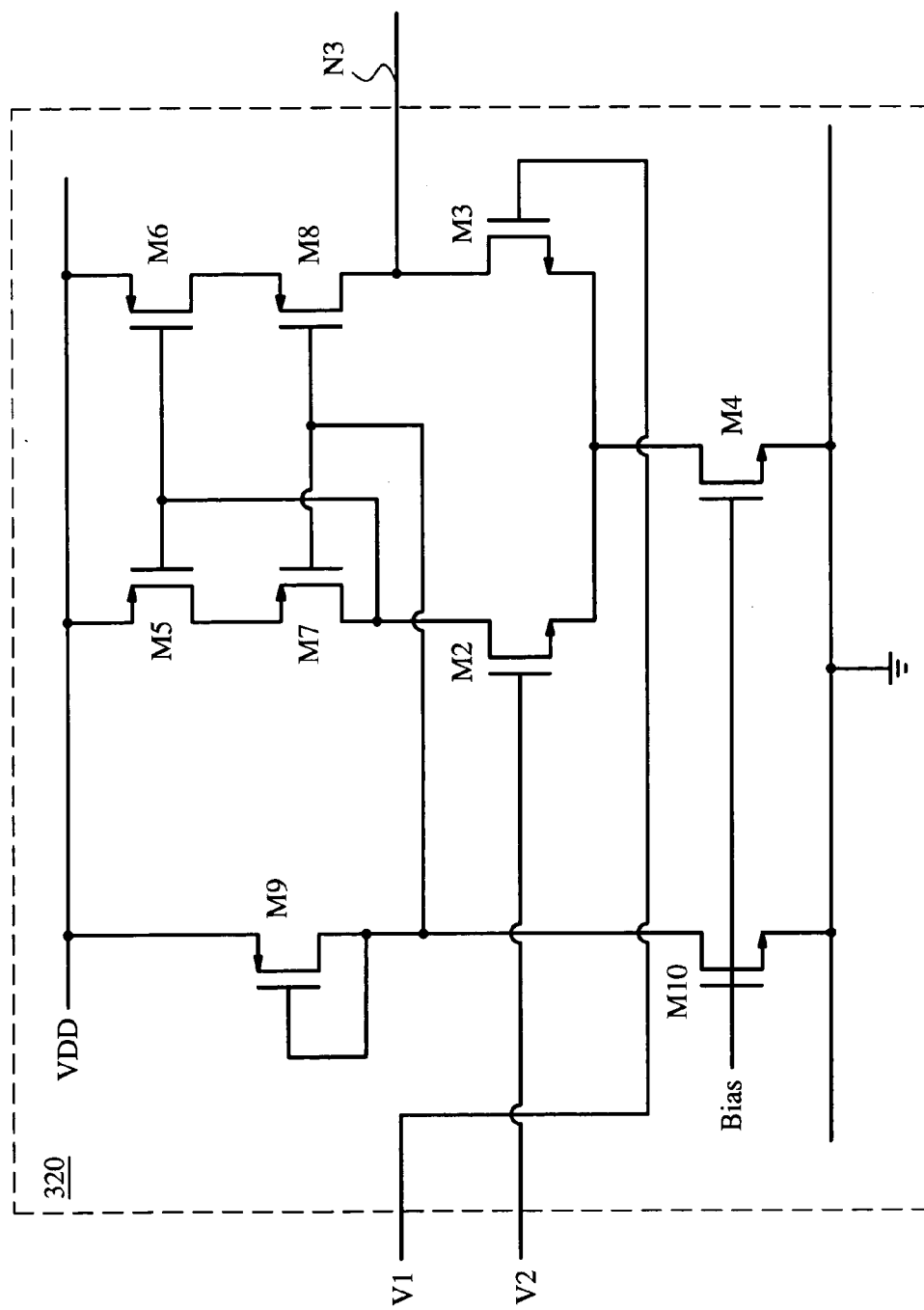
FIG. 3 schematically illustrates an embodiment of the differential amplifier of FIG. 1 or FIG. 2.

FIG. 3 schematically illustrates an embodiment of differential amplifier 320, which may be employed as an embodiment of differential amplifier 120 FIG. 1 or differential amplifier 220 of FIG. 2 above. Differential amplifier 320 includes transistors M2-M10. In one embodiment, transistor M5-M8 are all approximately the same size, and transistor M9 has approximately four times the channel length of the transistors M5-M8.

Differential amplifier 320 has a very high single-stage gain. By employing differential amplifier 320 in circuit 200, there is no requirement for gain on the output stage. In circuit 200, the output stage is transistor M0. Transistor M0 provides little gain, but it does need to since differential amplifier 320 has such a high gain.

Figure 4:
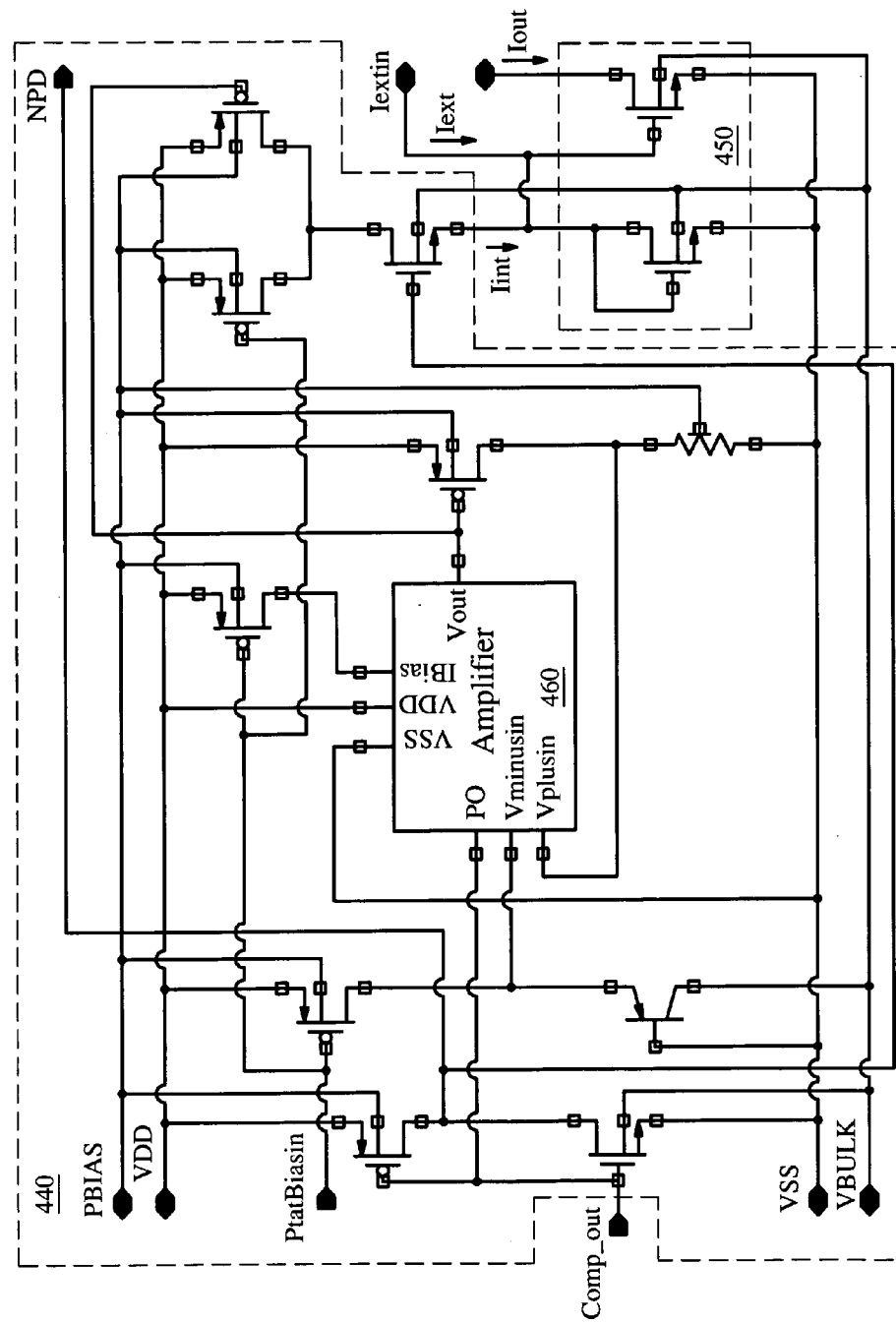
FIG. 4 shows a schematic diagram of an embodiment of the internal current source circuit and current mirror of FIG. 2, arranged in accordance with aspects of the present invention.

FIG. 4 shows a schematic diagram of an embodiment of internal current source circuit 440 and current mirror 450, which may be employed as embodiments of internal current source circuit 240 and current mirror 250 respectively of FIG. 2.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for a multi-function pin, comprising:
   a first transistor having at least a gate, a drain, and a source;
   a sense circuit that is coupled to the first transistor;
   a differential amplifier circuit having at least a first input, a second input, and an output, wherein the output of the differential amplifier circuit is coupled to the gate of the first transistor, and wherein the first input of the differential amplifier circuit is coupled to the sense resistor; and
   a comparison circuit having at least a first input that is coupled to the sense circuit.

2. The circuit of claim 1, wherein the sense circuit is coupled between the drain of the first transistor and the first input of the differential amplifier circuit.

3. The circuit of claim 1, further including a bandgap reference circuit that is arranged to provide a bandgap reference voltage to the second input of the differential amplifier.

4. The circuit of claim 1, wherein the differential amplifier includes:
   a cascode current mirror circuit, including:
      a first transistor having at least a gate, a drain, and a source;
      a second transistor having at least a gate, a drain, and a source, wherein the gate of the second transistor is coupled to the gate of the first transistor;
      a third transistor having at least a gate, a drain, and a source, wherein the drain of the third transistor is coupled to the gate of the first transistor;
      a fourth transistor including at least a gate, a drain, and a source, wherein the gate of the fourth transistor is coupled to the gate of the third transistor, and wherein a channel length of the first, second, third, and fourth transistors is approximately the same; and
      a fifth transistor including at least a gate, a drain, and a source, wherein the gate of the fifth transistor is coupled to the drain of the fifth transistor, the drain of the fifth transistor is coupled to the gate of the third transistor, and wherein a channel length of the fifth transistor is about four times the channel length of the first transistor; and
   a differential pair that is coupled to the cascode current mirror.

5. The circuit of claim 1, wherein the sense circuit is a sense resistor.

6. The circuit of claim 5, wherein the sense resistor has at least a plurality of tap points, the comparison circuit included a plurality of comparators, wherein each of the plurality of comparators has a first input, and wherein the first input of each of the plurality of comparators is coupled to a separate tap point of the plurality of tap points of the sense resistor.

7. The circuit of claim 5, wherein the comparison circuit includes a comparator having at least a first input that is coupled to the drain of the first transistor, and a second input that is coupled to the first input of the differential amplifier.

8. The circuit of claim 1, wherein the comparison circuit includes a comparator that is arranged to trip if an external resistor is coupled to the first input of the differential amplifier.

9. The circuit of claim 8, further comprising:
   a second transistor that is arranged in a current mirror relationship with the first transistor, wherein the second transistor is arranged to provide the output current based on the external resistor if the comparison circuit is tripped.

10. The circuit of claim 8, further comprising:
    an on-chip current source that is arranged to provide the output current if the comparison circuit is not tripped, and further arranged such that the on-chip current source is disabled if the comparison circuit is tripped.

11. The circuit of claim 10, further including a bandgap reference circuit that is arranged to provide a bandgap reference voltage to the second input of the differential amplifier, wherein the bandgap reference is a combined bandgap/sub-bandgap/proportional to absolute temperature (PTAT) current generation circuit, wherein the combined bandgap/sub-bandgap/PTAT current generation circuit is further arranged to provide a PTAT current to the on-chip current source.

12. A circuit for providing an output current, comprising:
    a differential amplifier having at least a first input, a second input, and an output, wherein the first input of the differential amplifier is coupled to a multi-function pin;
    a first transistor having at least a gate, a drain, and a source, wherein the gate of the first transistor is coupled to the output of the differential amplifier;
    a sense resistor that is coupled between the drain of the first transistor and the multi-function pin;
    a comparison circuit that is coupled to the sense resistor, wherein the comparison circuit is arranged to trip if an external resistor is coupled to the multi-function pin;
    an on-chip current source that is arranged to provide the output current if the comparison circuit is not tripped, and further arranged such that the on-chip current source is disabled if the comparison circuit is tripped; and
    a second transistor that is arranged in a current mirror relationship with the first transistor, wherein the second transistor is arranged to provide the output current based on the external resistor if the comparison circuit is tripped.

13. The circuit of claim 12, further including a bandgap reference circuit that is arranged to provide a bandgap reference voltage to the second input of the differential amplifier.

14. The circuit of claim 12, wherein the comparison circuit includes a comparator having at least a first input that is coupled to the drain of the first transistor, and a second input that is coupled to the first input of the differential amplifier.

15. The circuit of claim 12, wherein the differential amplifier includes:
    a cascode current mirror circuit, including:

a first transistor having at least a gate, a drain, and a source;

a second transistor having at least a gate, a drain, and a source, wherein the gate of the second transistor is coupled to the gate of the first transistor;

a third transistor having at least a gate, a drain, and a source, wherein the drain of the third transistor is coupled to the gate of the first transistor;

a fourth transistor including at least a gate, a drain, and a source, wherein the gate of the fourth transistor is coupled to the gate of the third transistor, and wherein a channel length of the first, second, third, and fourth transistors is approximately the same; and a fifth transistor including at least a gate, a drain, and a source, wherein the gate of the fifth transistor is coupled to the drain of the fifth transistor, the drain of the fifth transistor is coupled to the gate of the third transistor, and wherein a channel length of the fifth transistor is about four times the channel length of the first transistor; and a differential pair that is coupled to the cascode current mirror.

16. A method for a multi-function pin, comprising:

receiving a first voltage;

causing a voltage at the pin to be substantially the same as the first voltage;

if a current received at the pin falls within a first current range, performing a first function; and if the current received at the pin falls within a second current range, performing a second function, wherein the second function includes mirroring the current received at the pin.

17. The method of claim 16, wherein the first current range is a current of approximately zero, and the first function is providing an output current from an on-chip current source; and wherein the second current range is a current greater than approximately zero, and the second function is mirroring the current received at the pin to provide the output current.

18. A method for a multi-function pin, comprising:

receiving a first voltage;

causing a voltage at the pin to be substantially the same as the first voltage;

if a current received at the pin falls within a first current range, performing a first function; and if the current received at the pin falls within a second current range, performing a second function, wherein causing the voltage at the pin to be substantially the same as the first voltage includes:

providing the first voltage to a first input of a high-gain differential amplifier;

driving a transistor with the output of the differential amplifier such that the voltage at the pin is substantially the same as the first voltage, wherein the voltage at the pin is coupled to a second input of the high-gain differential amplifier, and wherein the differential amplifier is arranged in a closed loop.

19. The method of claim 18, further comprising determining whether the current is in the first current range or the second current ranging by comparing the voltages on each side of a sense resistor that is in the closed loop.

20. The method of claim 18, further comprising determining which of a plurality of current ranges the current received at the pin falls within, wherein the plurality of current ranges includes the first current range and the second current range, and wherein determining which of the plurality of current ranges the current received at the pin falls within is accomplished employing resistor in the closed loop and multiple trip points.

* * * * *